United States Patent
Ono

(10) Patent No.: US 9,589,826 B2
(45) Date of Patent: Mar. 7, 2017

(54) SAMPLE HOLDER

(71) Applicant: KYOCERA Corporation, Kyoto-shi, Kyoto (JP)

(72) Inventor: Hiroshi Ono, Kyoto (JP)

(73) Assignee: Kyocera Corporation, Kyoto (JP)

(*) Notice: Subject to any disclaimer, the term of this patent is extended or adjusted under 35 U.S.C. 154(b) by 30 days.

(21) Appl. No.: 14/770,045

(22) PCT Filed: Feb. 24, 2014

(86) PCT No.: PCT/JP2014/054335
§ 371 (c)(1),
(2) Date: Aug. 24, 2015

(87) PCT Pub. No.: WO2014/129625
PCT Pub. Date: Aug. 28, 2014

(65) Prior Publication Data
US 2016/0005639 A1 Jan. 7, 2016

(30) Foreign Application Priority Data

Feb. 25, 2013 (JP) .................................. 2013-034780

(51) Int. Cl.
*H01L 21/687* (2006.01)
*H01L 21/683* (2006.01)
(Continued)

(52) U.S. Cl.
CPC ...... *H01L 21/68757* (2013.01); *C04B 37/025* (2013.01); *C04B 37/026* (2013.01); *H01L 21/6831* (2013.01); *C04B 2235/3286* (2013.01); *C04B 2235/963* (2013.01); *C04B 2237/06* (2013.01); *C04B 2237/12* (2013.01); *C04B 2237/123* (2013.01); *C04B 2237/124* (2013.01); *C04B 2237/125* (2013.01); *C04B 2237/127* (2013.01); *C04B 2237/366* (2013.01); *C04B 2237/402* (2013.01); *C04B 2237/52* (2013.01);
(Continued)

(58) Field of Classification Search
CPC ........................ H01L 21/68757; C04B 37/026
USPC ........................................................ 361/234
See application file for complete search history.

(56) References Cited

U.S. PATENT DOCUMENTS 6,462,928 B1* 10/2002 Shamouilian ....... H01L 21/6833
361/234
8,573,469 B2* 11/2013 Hu ........................ H01L 33/405
228/179.1
(Continued)

FOREIGN PATENT DOCUMENTS

JP 2004-050267 A 2/2004

*Primary Examiner* — Dharti Patel
(74) *Attorney, Agent, or Firm* — Volpe and Koenig, P.C.

(57) ABSTRACT

A sample holder includes a substrate composed of ceramics, having a sample holding surface provided in an upper face thereof; a supporting member composed of metal, an upper face of the supporting member covering a lower face of the substrate; and a joining layer composed of indium or an indium alloy, the substrate and the supporting member being joined to each other via the joining layer. The joining layer has a layer region in at least one of a joining surface to the substrate and a joining surface to the supporting member, a content percentage of indium oxides of the layer region being higher than that of an intermediate region in a thickness direction of the joining layer.

10 Claims, 6 Drawing Sheets

(51) Int. Cl.
  *C04B 37/02* (2006.01)
  *H01L 21/67* (2006.01)
(52) U.S. Cl.
  CPC .. *C04B 2237/555* (2013.01); *C04B 2237/592* (2013.01); *C04B 2237/595* (2013.01); *C04B 2237/66* (2013.01); *C04B 2237/708* (2013.01); *C04B 2237/72* (2013.01); *H01L 21/67109* (2013.01)

(56) References Cited

U.S. PATENT DOCUMENTS

| | | | |
|---|---|---|---|
| 8,810,992 B2 * | 8/2014 | Ono | H01L 21/6833 361/234 |
| 9,150,967 B2 * | 10/2015 | Watanabe | C23C 4/02 |
| 9,324,589 B2 * | 4/2016 | Pease | H01L 21/67103 |
| 9,472,410 B2 * | 10/2016 | Sadjadi | H01L 21/28556 |
| 2002/0139563 A1 * | 10/2002 | Fujii | H01R 4/62 174/117 A |
| 2004/0016792 A1 * | 1/2004 | Fujii | B23K 35/26 228/194 |
| 2005/0098120 A1 * | 5/2005 | Maki | H01L 21/67103 118/728 |

* cited by examiner

SAMPLE HOLDER

TECHNICAL FIELD

The present invention relates to a sample holder for use in a film deposition apparatus such as a PVD apparatus, a CVD apparatus, and an ion plating apparatus, an exposure apparatus, an etching apparatus, or the like.

BACKGROUND ART

In a film deposition apparatus such as a PVD apparatus, a CVD apparatus and an ion plating apparatus, an exposure apparatus, an etching apparatus, or the like has been conventionally carried out adsorption of a workpiece to be processed such as a silicon wafer onto a surface of a plate-shaped member finished flat and smooth in order to fix the workpiece to be processed with precision. A sample holder utilizing an electrostatic adsorption force is employed as this adsorption means.

In such a sample holder, a sample holding surface (an adsorption surface) is provided in an upper face of the plate-shaped substrate composed of ceramics. In the sample holder, for example, an adsorption electrode is provided in an inside of the substrate and then a DC voltage is applied to the adsorption electrode so that an electrostatic adsorption force such as a Coulomb force caused by dielectric polarization and a Johnsen-Rahbek force caused by a minute leakage current is generated relative to the workpiece to be processed and thereby the workpiece to be processed can be adsorbed and fixed onto the sample holding surface.

The sample holder is used in a state where a supporting member is joined to a lower face thereof. For example, the supporting member includes a water passage provided in an inside of the supporting member and is constructed from a metallic material such as aluminum. Indium or an indium alloy is used for the joining. When such joining is to be performed, an underlayer of silver, copper, or the like having satisfactory wettability with indium is formed in advance in both of joining surfaces of the sample holder and the supporting member. Further, in some cases, an alloy of indium and tin, silver, or the like for reducing the melting point of indium is interposed between both of the joining surfaces of the sample holder and the supporting member.

Nevertheless, in a case where an underlayer having satisfactory wettability with indium is merely formed in both of the joining surfaces of the sample holder and the supporting member, the joining strength between the sample holder and the supporting member is difficult to be improved. Specifically, in a sample holder described in Japanese Unexamined Patent Publication JP-A 2004-50267 (referred to as Patent Literature 1, hereinafter), joining is performed by using an intermediate layer whose melting point is lower than the melting point of indium. Thus, there has been a possibility that when the sample holder goes into a high temperature, softening occurs in the intermediate layer so that the joining strength goes lower. Thus, there has been a possibility that the flatness and the parallelism of the sample holding surface vary in association with temperature cycles. As a result, the flatness and the parallelism of the sample holding surface have been difficult to be maintained.

SUMMARY OF INVENTION

The sample holder according to an embodiment of the invention includes a substrate composed of ceramics, having a sample holding surface provided in an upper face thereof; a supporting member composed of metal, an upper face of the supporting member covering a lower face of the substrate; and a joining layer composed of indium or an indium alloy, the substrate and the supporting member being joined to each other via the joining layer, the joining layer having a layer region in at least one of a joining surface to the substrate and a joining surface to the supporting member, a content percentage of indium oxides of the layer region being higher than that of an intermediate region in a thickness direction of the joining layer.

DESCRIPTION OF EMBODIMENTS

A sample holder according to an embodiment of the invention is described below in detail with reference to the drawings.

Figure 1:
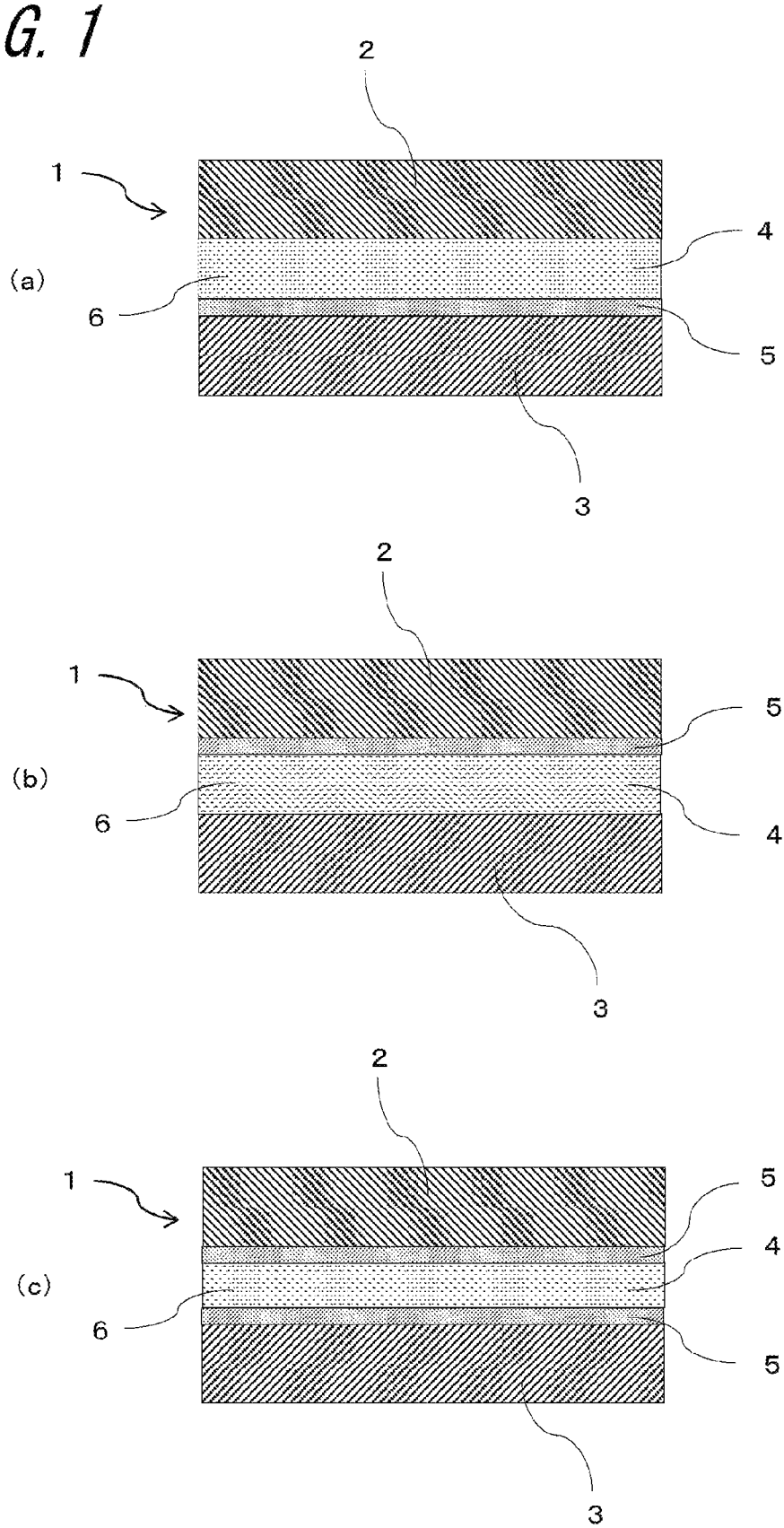
FIG. 1 is sectional views showing a sample holder of an embodiment of the invention.

FIG. 1 is sectional views showing an embodiment of a sample holder of the invention. The sample holder 1 shown in FIGS. 1(a) and 1(b) comprises a substrate 2 which is composed of ceramics and has a sample holding surface provided in the upper face thereof; a supporting member 3 composed of metal, an upper face of the supporting member 3 covering a lower face of the substrate 2; a joining layer 4 composed of indium (In) or an indium alloy, the substrate 2 and the supporting member 3 being joined to each other via the joining layer 4. Then, the joining layer 4 has a layer region 5 in at least one of a joining surface to the substrate 2 and a joining surface to the supporting member 3, wherein a content percentage of indium oxides of the layer region 5 is higher than that of an intermediate region 6 in a thickness direction of the joining layer 4. Specifically, in FIG. 1(a), the layer region 5 is located in the joining surface between the joining layer 4 and the supporting member 3. Further, in FIG. 1(b), the layer region 5 is located in the joining surface between the joining layer 4 and the substrate 2. The intermediate region 6 mentioned here indicates a region described below. Specifically, as shown in FIG. 1(a), in a case where the layer region 5 is located in the joining surface between the joining layer 4 and the supporting member 3, a portion located above the layer region 5 in the joining layer 4 is the intermediate region 6. Further, as shown in FIG. 1(b), in a case where the layer region 5 is located in the joining surface between the joining layer 4 and the substrate 2, a portion located below the layer region 5 in the joining layer 4 is the intermediate region 6. Further, as shown in FIG. 1(c), in a case where the layer region 5 is located respectively in the joining surface between the joining layer 4 and the supporting member 3 and the joining surface between the joining layer 4 and the substrate 2, a portion located in the middle of the two layer regions 5 is the intermediate region 6.

Here, the here-mentioned layer region 5 of which the content percentage of indium oxides is higher is, for example, a situation that indium oxides are present in indium or an indium alloy. Further, another example of the layer region 5 of which the content percentage of indium oxides is higher is a situation that the entire layer region 5 is composed of indium oxides.

For example, the intermediate region 6 and the layer region 5 can be distinguished from each other by the following method. Specifically, the sample holder 1 is cut into a cross section perpendicular to the sample holding surface. Then, ion etching is performed on the portion containing the joining layer 4 in the sample holder 1 by approximately 0 to 1 μm by using an argon (Ar) ion gun so that the cut surface is cleaned. Further, in the region of the joining layer 4 in the cut surface, elemental surface analysis or elemental line analysis in the joining layer depth direction is performed concerning oxygen by using an Auger electron spectrometer. In the result of elemental surface analysis or the result of elemental line analysis obtained as mentioned here, the maximum and the minimum of the amount of oxygen are checked and then the value of the half of the sum of the maximum and the minimum is calculated. Then, in the vicinity of the joining surface to the substrate 2 or the supporting member 3 within the joining layer 4, a region where the amount of oxygen is higher than the value of the half of the sum of the maximum and the minimum may be regarded as the layer region 5. Further, a region where the amount of oxygen is lower than the value of the half of the sum of the maximum and the minimum may be regarded as the intermediate region 6. The ceramic material constituting the substrate 2 may be selected in accordance with a predetermined purpose and is not limited to particular one. In a case where the sample holder is employed as an electrostatic chuck, oxide-based ceramics such as alumina, sapphire, alumina-titania composite, and barium titanate or, alternatively, nitride-based ceramics such as aluminum nitride is preferably employed.

The metal constituting the supporting member 3 is not limited to particular one. Metals mentioned here also include ceramic-metal composites and composite materials composed of metal such as a fiber-reinforced metal. In general, in an environment of being exposed to a corrosive gas of halogen family or the like, it is preferable to employ aluminum (Al), copper (Cu), stainless steel, nickel (Ni), or an alloy of these metals. Further, although the structure is not limited to particular one, for example, like in a modified example (see FIG. 6) described later, it is preferable to provide a passage used for circulating a heat carrier such as gas and liquid. In this case, as a heat medium, a liquid such as water or silicone oil or, alternatively, a gas such as helium (He) and nitrogen ($N_2$) is preferably employed.

For example, as shown in FIGS. 1(a) and 1(b), in order to form the layer region 5 where the content percentage of indium oxides is high, the following method may be employed. Specifically, molten metal of indium or an indium alloy may be applied to a part or the entirety of the joining surface of the substrate 2 and/or the joining surface of the supporting member 3 in the atmosphere. Then, the molten metal may be spread thinly by using a turner fabricated from polytetrafluoroethylene or by using a heat-resistant rag and then heated to 180° C. or higher. By virtue of this method, a reaction between indium (In) and oxygen (O) is accelerated so that the layer region 5 composed of indium oxides can preferably be formed.

A portion other than the layer region 5 in the joining layer 4 can be formed by heating the substrate 2 and the supporting member 3 in which the above-mentioned layer region 5 has been formed are to or above 156.6° C. which is the melting point of indium and then newly interposing molten metal of indium or an indium alloy between the substrate 2 and the supporting member 3. In a case where the molten metal is not to be employed, the substrate 2 and the supporting member 3 in which the layer region 5 has been formed may be once cooled to a room temperature, then an indium foil may independently be provided, and then the substrate 2 and the supporting member 3 may be heated again to or above the melting point of indium so that the joining layer 4 may be formed. By virtue of such a method, it is obtain the joining layer 4 having the layer region 5 of which the content percentage of indium oxides is higher than that of the intermediate region 6.

Here, the indium constituting the joining layer 4 is of pure metal or an indium alloy. Here, the pure metal of indium may contain an impurity unavoidable by fabrication reason. As the metal to be mixed with indium into an alloy, such a metal that the melting point of the alloy does not fall to or below 156.6° C. which is the melting point of pure metal of indium can preferably be employed.

In the sample holder 1 obtained as described above, the melting point of the layer region 5 is higher than or equal to the melting point of the joining layer 4, the joining interface is hard to deform under heat cycles. Further, the joining strength between the layer region 5 and substrates 2 or between the layer region 5 and the supporting member 3 is high and hence the flatness and the parallelism of the sample holding surface can be maintained even under heat cycles.

More preferably, as shown in FIG. 1(c), it is preferable to form the layer region 5 respectively in the joining surface between the joining layer 4 and the substrate 2 and the joining surface between the joining layer 4 and the supporting member 3. By virtue of this, the flatness and the parallelism of the sample holding surface can more stably be maintained.

Figure 2:
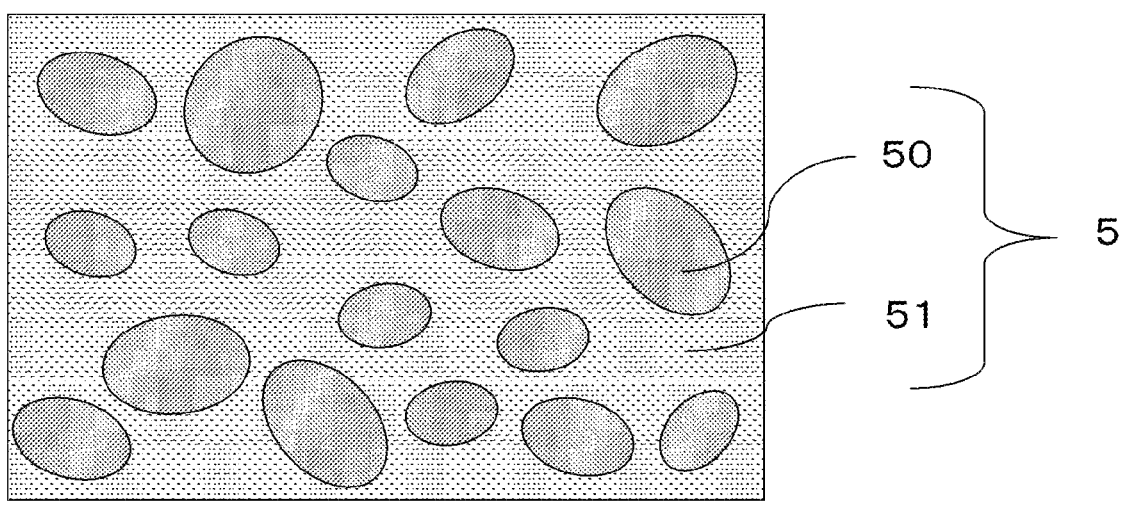
FIG. 2 is a partly sectional view showing a layer region of modified example 1 to a sample holder of the invention.

Here, in the layer region 5, as shown in the partly sectional view given in FIG. 2, a portion 50 composed of indium oxides and a portion 51 composed of indium or an indium alloy may be mixed within the joining surface to the substrate 2 or the joining surface to the supporting member 3. The indium or the indium alloy has a low Young's modulus and hence remarkably soft. Thus, at the time of heating or cooling during the use, even when distortion arises owing to a thermal expansion difference between the joining layer 4 and the substrate 2 or between the joining layer 4 and the supporting member 3, the portion 51 composed of indium or an indium alloy can alleviate this.

Here, it is preferable that the layer region 5 of which the content percentage of indium oxides is higher is provided over the entire joining surface as shown in FIGS. 1(a) to 1(c). By virtue of this, the flatness and the parallelism of the sample holding surface can more stably be maintained.

Figure 3:
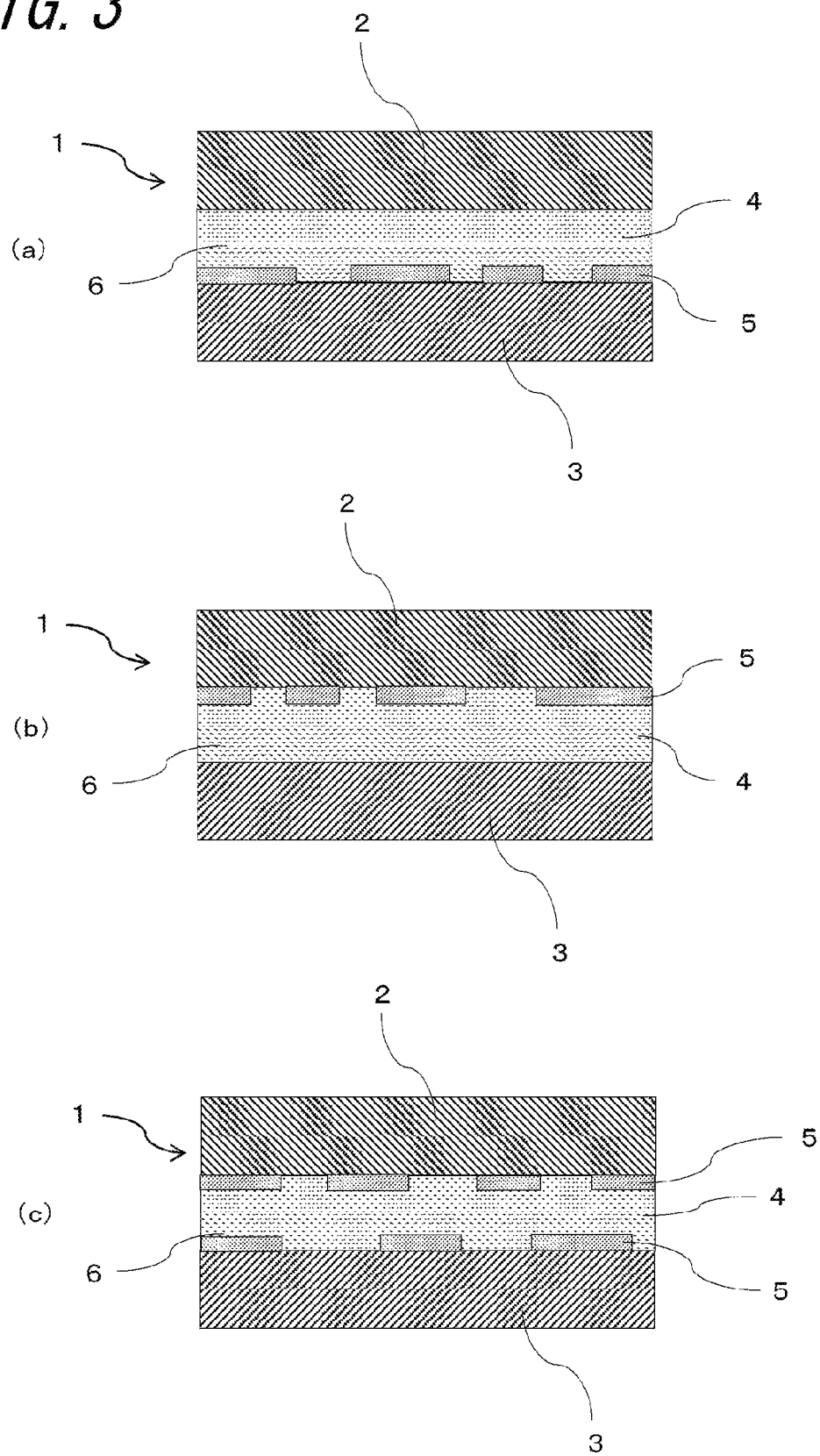
FIG. 3 is sectional views showing modified example 2 to a sample holder of the invention.

Further, as shown in FIGS. 3(a) to 3(c), the layer region 5 composed of indium oxides may be provided in a part of the joining surface. Specifically, it is preferable that the joining layer 4 composed of indium or an indium alloy and the layer region 5 of which the content percentage of indium oxides is higher are present in the joining surface. The joining layer 4 composed of indium having satisfactory heat conduction allows heat to be satisfactorily transferred. This reduces occurrence of variation in the heat distribution between the substrate 2 and the supporting member 3. As a result, the flatness and the parallelism of the sample holding surface under heat cycles can more stably be maintained.

Figure 4:
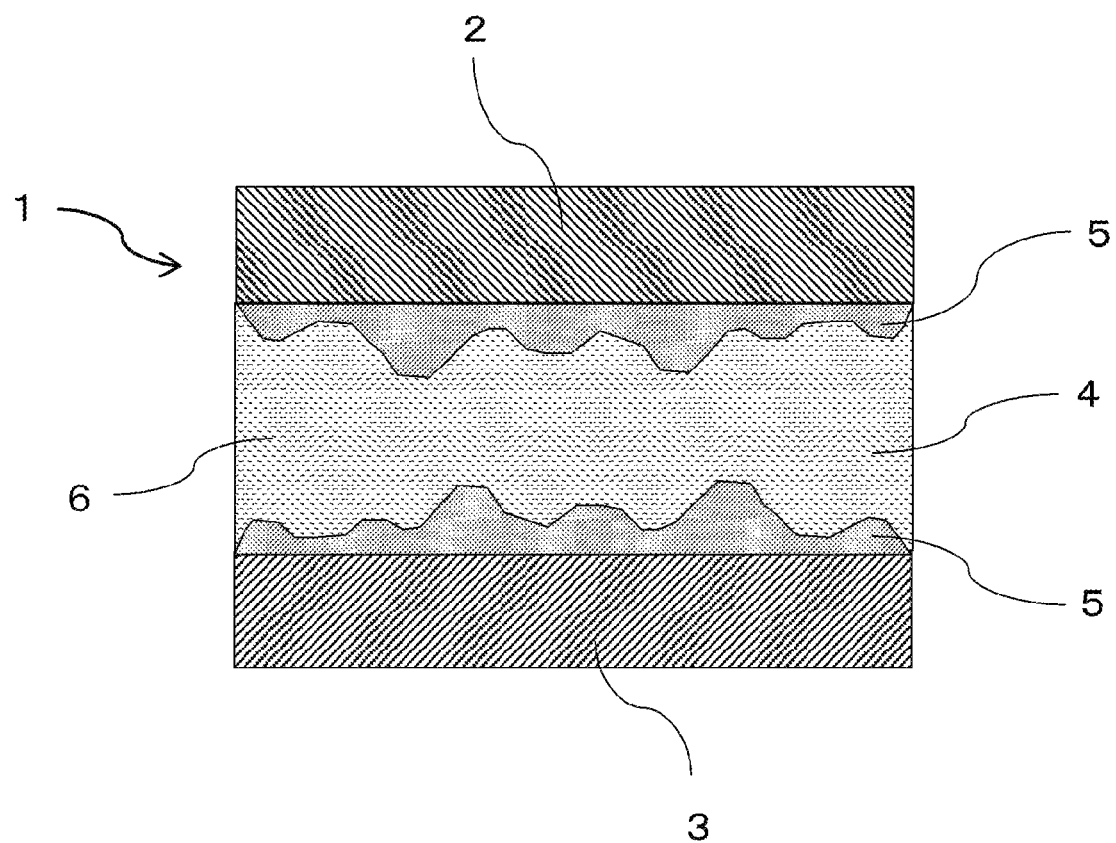
FIG. 4 is a sectional view showing modified example 3 to a sample holder of the invention.

Further, as shown in FIG. 4, the interface between the intermediate region 6 and the layer region 5 may be an uneven surface. When the interface is formed in an uneven surface as described here, an anchor effect occurs between the intermediate region 6 and the layer region 5. As a result, the strength of the joining layer 4 can further be improved.

At that time, in the joining interface, it is preferable that the unevenness height is irregular as shown in FIG. 4. For example, even when the joining layer 4 having become soft in a high-temperature environment is to be slid in a horizontal direction by a thermal stress, the joining layer 4 is caught by the layer region 5 of which the content percentage of hard indium oxides is higher, and thereby the horizontal slide is suppressed. As a result, a possibility can be reduced that warpage occurs in the sample holder 1.

Further, the indium oxides that form the layer region 5 have as a high volatilization temperature as 850° C. and are remarkably hard. Thus, the joining interface of the layer region 5 hardly deforms. As a result, the flatness and the parallelism of the sample holding surface can be maintained. Further, the indium oxides have a higher volume resistivity than indium and hence serve as a radio wave absorber (a noise filter). That is, in a case where the sample holder is an electrostatic chuck, a high-frequency noise is hard to be superposed on the adsorption electrode in a high-frequency environment. As a result, temporal fluctuation in the adsorption force of the sample holder 1 to the wafer can be suppressed.

Further, it is preferable that as shown in FIGS. 5(a) to 5(c), a covering layer 7 containing one or more of metals having a higher standard redox potential $E^O$ than indium (the indium standard redox potential $E^O$=−0.34 V) is provided in at least one of the lower face of the substrate 2 and the upper face of the supporting member 3. In a case where the covering layer 7 is composed of a metal nobler than indium or, alternatively, the main component is composed of a noble metal, electrochemical interface corrosion temporally occurring when dissimilar metals are in contact with each other, that is, anodic dissolution of the supporting member 3, can be suppressed. As a result, the long-term reliability of the sample holder 1 can be improved. Here, the metal nobler than indium indicates a metal having a higher standard redox potential $E^O$ than indium. Specifically, such metals include nickel (the nickel standard redox potential $E^O$=−0.257 V), copper (the copper standard redox potential $E^O$=+0.34 V), silver (the silver standard redox potential $E^O$=+0.799 V), palladium (the palladium standard redox potential $E^O$=+0.915 V), platinum (the platinum standard redox potential $E^O$=+1.188 V), and gold (the golden standard redox potential $E^O$=+1.52 V).

Further, it is preferable that the covering layer 7 contains at least one of nickel, copper, and silver-copper-titanium. These metals easily form a tight oxide film. Thus, above-mentioned interface corrosion can be suppressed further.

Figure 6:
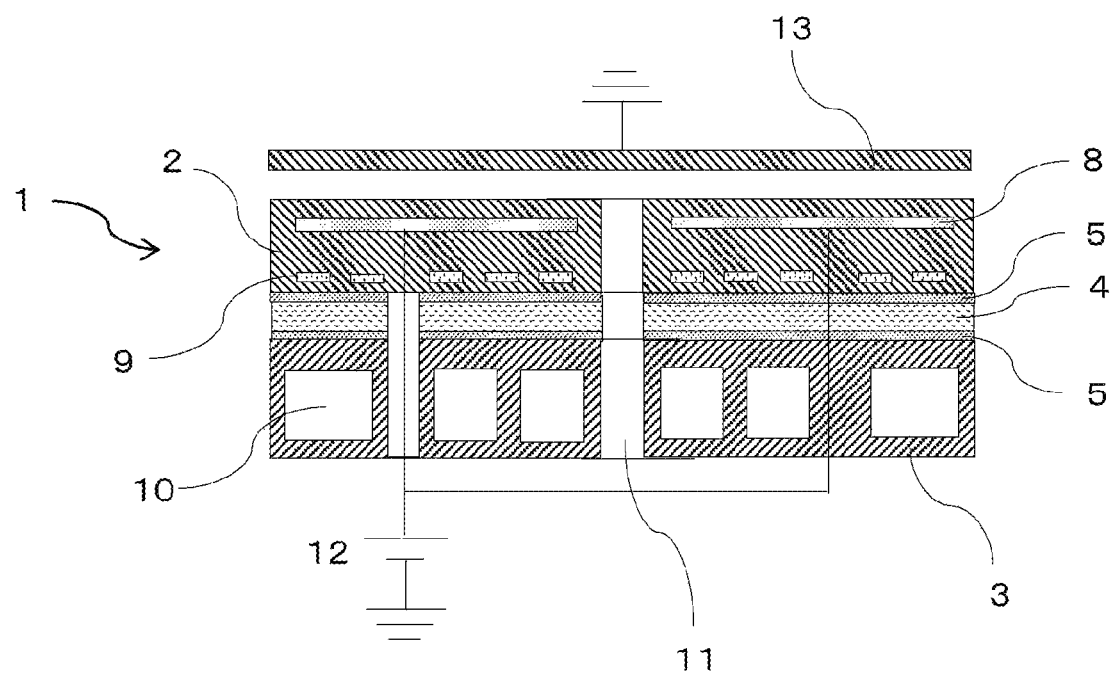
FIG. 6 is a sectional view showing modified example 5 to a sample holder of the invention.

FIG. 6 shows a modified example to the sample holder 1 of the invention. In the present modified example, the sample holder 1 is an electrostatic chuck. The substrate 2 is formed in a disk shape having a size comparable to a to-be-held object 13 such as a silicon wafer. Then, the upper face serves as the sample holding surface for the to-be-held object 13. Further, the substrate 2 includes an electrostatic adsorption electrode 8 located in an inside of the substrate 2. The construction material and the structure of the electrostatic adsorption electrode 8 are not limited to particular ones. The electrostatic adsorption electrode 8 can be obtained, for example, by forming a metal such as platinum and tungsten into a predetermined shape by employing a screen printing method or, alternatively, by burying a metallic foil.

The electrostatic adsorption electrode 8 is connected to a lead wire and then is connected through the lead wire to a DC power supply 12. On the other hand, the to-be-held object 13 adsorbed to the sample holding surface is connected to the ground directly or, alternatively, electrically through plasma. By virtue of this, an electrostatic adsorption force acts between the adsorption electrode 8 and the to-be-held object 13 so that the to-be-held object 13 can be adsorbed and fixed onto the sample holding surface.

Further, the center part of the substrate 2 is provided with a gas introduction hole 11 penetrating from the lower face of the supporting member 3 to the holding surface of the substrate 2. Further, a gas passage (not shown) is formed in a region of vicinity of the sample holding surface. Then, the gas passage is in communication with the gas introduction hole 11. Then, when the to-be-held object 13 is adsorbed to the sample holding surface, a cooling gas such as helium gas is supplied through the gas introduction hole 11 to a space constructed by the to-be-held object 13 and the gas passage, and thereby heat transfer between the gas passage and the to-be-held object 13 and between the sample holding surface and the to-be-held object 13 is made satisfactory so that control is achieved such that the temperature distribution in the to-be-held object 13 may become uniform.

As described above, when the joining between the substrate 2 and the supporting member 3 is formed by the joining layer 4 having the layer region 5, the flatness and the parallelism of the substrate 2 can be maintained. Thus, a gap is hard to occur between the to-be-held object 13 and the substrate 2. By virtue of this, fluctuation can be reduced in the adsorption force within the surface of the to-be-held object 13 at the time that the electrostatic chuck is heated and used.

Further, in the electrostatic chuck serving as the sample holder 1 of the present modified example, the substrate 2 includes a heat-generating resistor 9 which is used for heating and located in an inside of the substrate 2. The construction material and the structure of the heat-generating resistor 9 are not limited to particular ones. The heat-generating resistor 9 is obtained, for example, by forming a metal such as platinum and tungsten into a predetermined shape by employing a screen printing method or, alternatively, by burying a coil of wire or the like.

Also in this case, when the joining between the substrate 2 and the supporting member 3 is formed by the joining layer 4 having the layer region 5, the flatness and the parallelism of the substrate 2 can be maintained. Thus, the to-be-held object 13 can uniformly be heated and hence fluctuation in the temperature of the to-be-held object 13 at the time of heated use can be reduced.

Further, it is preferable that the supporting member 3 includes a passage 10 for heat medium located in the inside of the supporting member 3. Then, the flatness and the parallelism of the substrate 2 can be maintained and hence temperature fall or temperature rise can be made uniform over the entire surface of the to-be-held object 13. As a result, the process treatment speed for the to-be-held object 13 is increased.

A fabrication method for the sample holder 1 is described below. Here, the following description is given for an example that aluminum nitride is employed as the material for the substrate 2. However, even when another ceramic material is employed, fabrication can be achieved by the same technique.

First, aluminum nitride powder serving as a main raw material and material powder serving as a sintering aid are weighed by predetermined amounts and then wet crushing and mixing is performed for 24 to 72 hours together with a solvent such as ion exchange water and an organic solvent, organic dispersing agent, and balls composed of metal or ceramics and covered with resin such as urethane and nylon in the inside of a ball mill lined with resin such as urethane and nylon. The resin used for the resin lining or for the resin coated balls may suitably be selected from those not dissolved or swollen in the solvent to be used.

Predetermined amounts of an organic binder such as polyvinyl alcohol, polyvinyl butyral, and acrylic resin and a plasticizer and an antifoaming agent serving as auxiliary organic materials are added to the raw material slurry obtained by crushing and mixing as described above. Then, the raw material slurry is mixed further for 24 to 48 hours. The organic-inorganic slurry mixture obtained by mixing is formed into a ceramic green sheet having a thickness of 20 μm to 20 mm by a doctor blade method, a calender roll method, a press molding method, an extrusion molding method, or the like.

Then, a paste-state electrode material such as platinum and tungsten for forming the adsorption electrode 8 and the heat-generating resistor 9 is printed on ceramic green sheets for forming the substrate 2 composed of ceramics, by a publicly known screen printing method or the like.

Here, in order to form the adsorption electrode 8 and the heat-generating resistor 9 at predetermined positions in the substrate 2, ceramic green sheets on which the paste-state electrode material is not printed and the above-mentioned green sheets on which the paste-state electrode material has been printed are laid and stacked on each other. As for the stacking, stacking is performed at a predetermined temperature in a state where a pressure at or above the yield stress value of the ceramic green sheet is applied. As the pressure applying technique, a publicly known technique such as a uniaxial pressing method and an isostatic pressing method (a dry or wet method) may be applied.

Then, the obtained stack is fired at a predetermined temperature in a predetermined atmosphere so that the substrate 2 is fabricated in which the adsorption electrode 8 and the heat-generating resistor 9 are buried. Further, an active brazing material composed of 70 mass % of silver (Ag), 28 mass % of copper (Cu), and 2 mass % of titanium (Ti) is fired onto the joining surface of the substrate 2 at 810° C. in vacuum so that a joining underlayer having a thickness of 20 μm is formed.

Then, the supporting member 3 is fabricated. As the supporting member 3, a supporting member is fabricated which is fabricated from aluminum (Al) A6061 and in the inside of which a predetermined water passage is formed for circulating cooling water. The introduction hole and the discharge hole for the heat medium circulated through the water passage are formed in a face different from the joining surface. Zinc (Zn) plating of thickness 1 to 2 μm is performed on the joining surface of the supporting member 3 and then electroless nickel (Ni) plating of thickness 2 to 5 μm is performed thereon so that a joining underlayer is formed.

Then, in order to form the layer region 5 of which the content percentage of indium oxides is higher, molten metal of pure indium (In) is introduced to the joining surface of the substrate 2 and/or the supporting member 3 in the atmosphere, then spread thinly with a turner fabricated from polytetrafluoroethylene, and then heated for 10 minutes or longer at a temperature higher than or equal to 156.6° C. which is the melting point of pure indium and lower than or equal to 250° C., preferably at 170° C. to 210° C., and more preferably at 170° C. to 190° C. When heating is performed at or below 250° C., the reaction between pure indium and oxygen in the atmosphere can be suppressed and, when heating is performed at or above 156.6° C., indium can be melted. As described above, as the layer region 5 of which the content percentage of indium oxides is higher, a layer region composed of indium oxides is formed.

Then, the substrate 2 and the supporting member 3 in which the layer region 5 has been formed are heated at a temperature higher than or equal to 156.6° C. which is the melting point of indium and lower than or equal to 250° C., preferably at 170° C. to 210° C., and more preferably at 170° C. to 190° C. Then, molten metal of pure indium is newly poured on the layer region 5 of the supporting member 3 to be arranged on the lower side at the time of joining. Then, the joining surface (the face of the layer region 5) of the substrate 2 is laid thereon, then a weight is placed thereon, and then natural cooling is performed so that the joining layer 4 is formed. The weight at the time of joining is not limited to particular one. However, it is satisfactory to employ a weight having a joining load of 0.05 MPa or higher, preferably 0.1 MPa or higher, more preferably 0.2 MPa or higher. Further, the weight may have a size similar to the substrate 2 or, alternatively, a plurality of weights having a small size may be arranged. Then, in a case where a plurality of holes are formed in the substrate 2, a plurality of weights having a small size are arranged in the surroundings of the hole is preferable in that fluctuation in the thickness of the joining layer 4 in the surroundings of the hole can be reduced.

By virtue of the above-mentioned fabrication method, the sample holder 1 can be fabricated in which the flatness and the parallelism of the sample holding surface can be maintained.

Here, the layer region 5 may be formed in a predetermined portion alone in accordance with the purpose. In this case, a publicly known heat-resistant resin film or sheet such as a heat-resistant adhesion polyimide sheet and a heat-resistant adhesion polytetrafluoroethylene sheet may be stuck as a masking material onto the substrate 2 or the supporting member 3 and then the layer region 5 may be formed in this state. When the layer region 5 is formed in the predetermined portion and, after that, the masking material is removed, the portion other than the layer region 5 in the joining layer 4 composed of pure indium or an indium alloy to be formed after that can be formed in the portion where the layer region 5 is not formed within the substrate 2 or the supporting member 3. By virtue of this method, the layer region 5 can partly be formed.

Further, like in the partly sectional view showing in FIG. 2, in a case where the layer region 5 where the portion 50 composed of indium oxides and the portion 51 composed of indium or an indium alloy are mixed is to be formed respectively in the joining surface to the substrate 2 and the joining surface to the supporting member 3, it is sufficient that the substrate 2 or the supporting member 3 contains a metallic component whose standard redox potential is lower than the standard redox potential of pure indium. That is, when the ionization tendency of the metallic component is made higher than that of pure indium, the above-mentioned layer region 5 can be formed. This mechanism of formation is expected to be based on an electrochemical displacement reaction or an anodic dissolution mechanism.

Further, in a case where a state where the portion 50 composed of indium oxides and the portion 51 composed of indium or an indium alloy are mixed is to be formed in the layer region 5, the following method may be employed. Specifically, at the time of forming the layer region 5, in place of heating in the atmosphere, when heating is performed in a mixed gas composed of an inert gas such as nitrogen and argon and oxygen, the layer region 5 can be formed where pure indium or an indium alloy and indium oxides are mixed. At that time, as for the oxygen concentration, 2 mass % or lower is preferable and 1 mass % or lower is more preferably. When the oxygen concentration is set to be low, the indium oxides in the layer region 5 can be brought into a small size and distributed finely.

Figure 5:
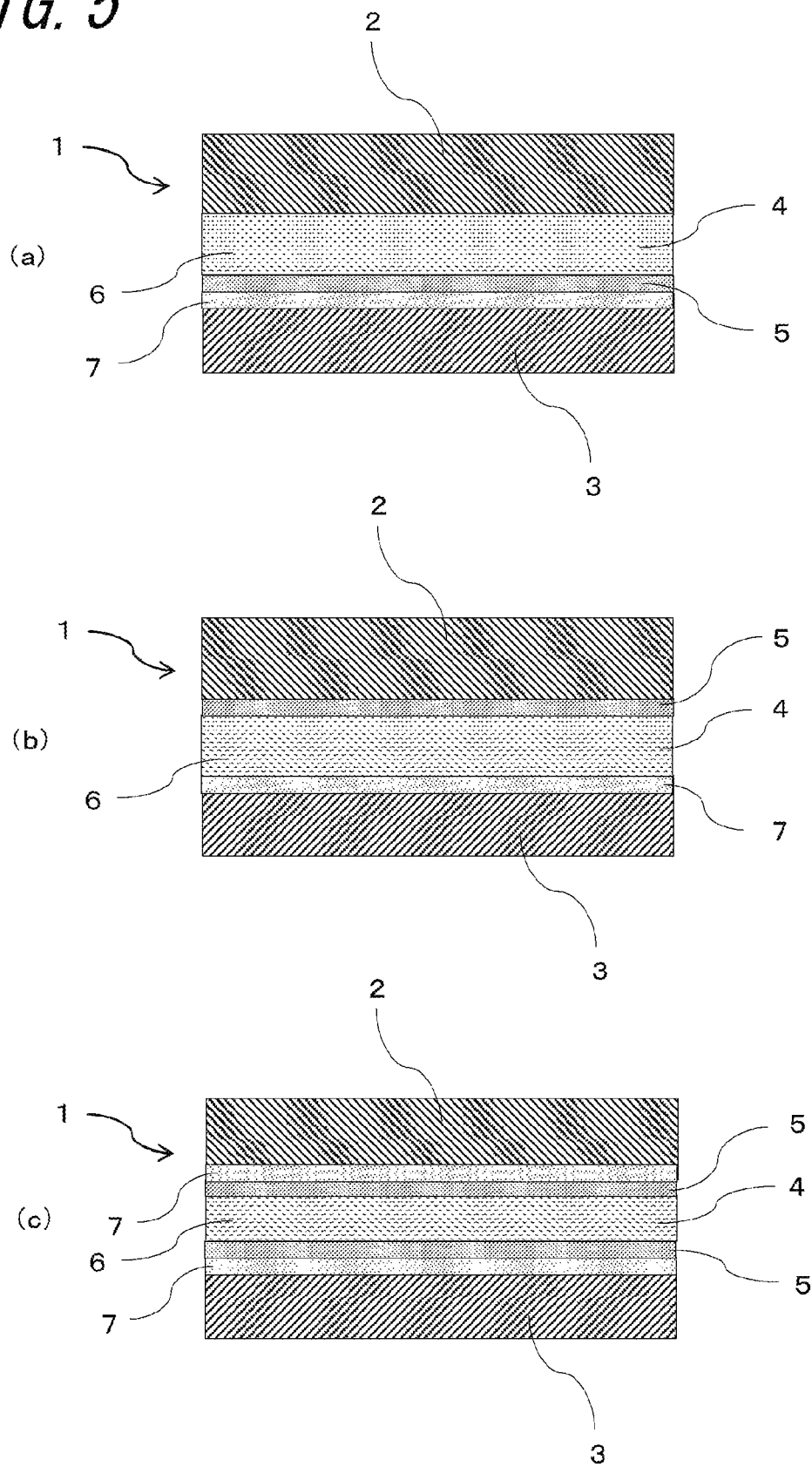
FIG. 5 is sectional views showing modified example 4 to a sample holder of the invention.

Further, in a case where the covering layer 7 shown in FIG. 5 is to be formed, a layer composed of a noble metallic component whose standard redox potential is higher than the standard redox potential of pure indium may be formed in the substrate 2 or the supporting member 3 by a publicly known technique such as plating, vacuum deposition, or an active metal metallization method.

EXAMPLE 1

As for the sample holder 1 of the invention having the structure shown in FIGS. 1(a) to 1(c), ten samples were fabricated as follows. Specifically, first, the substrate 2 and the supporting member 3 composed of ceramics were prepared.

The substrate 2 is constructed from aluminum nitride having a length of 50 mm, a width of 50 mm, and a thickness of 15 mm. In fabrication of the substrate 2, aluminum nitride powder having a purity of 99.9 mass % and an average grain diameter D50 of 0.5 µm was employed. Then, 80 mass part of toluene and 0.5 mass part of a dispersant were added to 100 mass part of the powder. Then, wet crushing and mixing was performed for 48 hours together with resin-coated balls of φ20 mm in the inside of a ball mill lined with nylon.

Then, a plasticizer and a binder were added to the wet crushed and mixed slurry. As for the plasticizer, dibutyl phthalate and dioctyl phthalate were added by 2 mass part each to 100 mass part of the aluminum nitride powder and, as the binder, 12 mass part of polyvinyl butyral in solid content equivalent was added. Then, wet mixing was performed further for 30 hours. Then, the organic-inorganic slurry mixture obtained by mixing was formed into a ceramic green sheet having a thickness of 300 µm by a doctor blade method. Then, the green sheets were laid on each other into a predetermined thickness and then stacking was performed at a temperature of 80° C. or higher with applying a pressure higher than or equal to the yield stress of the green sheet, specifically, a pressure of 5 MPa, by using a uniaxial pressing method.

Then, the obtained stack was fired in a reducing atmosphere at 2000° C. for 3 hours so that the substrate 2 was obtained. In the obtained substrate 2, thickness machining was performed by a rotary grinding process and dimension machining was performed by a parallel grinding process. Further, the holding surface was finished by lapping into an arithmetic mean roughness Ra of 0.1 µm or smaller and the joining surface was finished into an arithmetic mean roughness Ra of 1.6 µm or smaller.

On the other hand, the supporting member 3 was fabricated by machining an aluminum A6061 alloy into a length of 50 mm, a width of 50 mm, and a thickness of 15 mm. The joining surface was finished by lapping into an arithmetic mean roughness Ra of 1.6 µm or smaller.

Then, for nine samples (sample Nos. 2 to 10), molten metal of pure indium was introduced over the entire joining surface of the substrate 2 and/or the supporting member 3 in the atmosphere, then spread thinly with a turner fabricated from polytetrafluoroethylene, and then heated at 180° C. for 10 minutes so that the layer region 5 composed of indium oxides was formed. Then, X-ray photoelectron spectroscopy (XPS), transmission electron microscopy (TEM), and electron energy loss spectroscopy (EELS) were performed on the layer region 5 so that formation of indium oxides was confirmed.

The samples (sample Nos. 2 to 10) which are formed as described above and provided with the layer region 5 were heated again to 175° C. in a predetermined atmosphere. Then, a spacer composed of a φ0.6-mm Cu wire is placed on the layer region 5 of the supporting member 3 to be arranged on the lower side at the time of joining, and then molten metal of pure indium was newly poured. After that, the joining surface of the substrate 2 was laid thereon, then a weight was placed such that the joining load becomes 0.2 MPa, and then natural cooling was performed so that the portion other than the layer region 5 in the joining layer 4 was formed.

Further, as a comparison object, a sample holder (sample No. 1) which is not provided with the layer region 5 was also fabricated. Specifically, the substrate and the supporting member was heated to 170° C. in an $N_2$ atmosphere and then molten metal of pure indium was introduced respectively to the entire joining surfaces so that an underlayer of indium was formed. Then, indium molten metal was added immediately and then the both were bonded together so that they were joined together. As for the underlayer, a test piece was fabricated apart from the objects for the evaluation described below and then analysis similar to the above-mentioned one was performed. According to the result, the underlayer was composed of pure indium.

Then, the parallelism and the flatness of the fabricated sample holder 1 were measured with a three-dimensional measurement machine. After that, with adopting a definition that a cycle of heating from 0° C. to 120° C. and then cooling from 120° C. to 0° C. is counted as one cycle, a cooling-heating durability test of 300 cycles was performed. After the durability test, the parallelism and the flatness were measured again with the three-dimensional measurement machine and then the change ratios from the initial values were calculated. At that time, a change ratio of 1% or smaller was treated as no change from the initial value.

Further, ultrasonic crack inspection was performed before and after the above-mentioned cooling-heating durability test. In the sample holder 1 (sample Nos. 2 to 10) of the invention, separation did not occur in the joining layer 4 or the layer region 5. In contrast, in sample No. 1 serving as a comparison object, separation was confirmed in a part of the outer peripheral edge portion.

Further, the ten-point average roughness RzJIS of the layer region 5 was measured for the test pieces of the sample holder. The results of measurement are shown in Table 1.

TABLE 1

| | | | Substrate-side layer region | | | Supporting member-side layer region | | | After 300 cycles of 0° C. ↔ 120° C. | | |
|---|---|---|---|---|---|---|---|---|---|---|---|
| Sample No. | Substrate-side layer region composition | Supporting member-side layer region composition | Formation region | Thickness [μm] | RzJIS [μm] | Formation region | Thickness [μm] | RzJIS [μm] | Flatness change ratio [%] | Parallelism change ratio [%] | Ultrasonic crack inspection |
| *1 | Indium | Indium | | | | | | | 10 | 6 | With separation |
| 2 | Indium oxide | Indium | Entirety | 31 | 18 | | | | 0.9 | 0.8 | No separation |
| 3 | Indium oxide | Indium | Entirety | 49 | 28 | | | | 0.5 | 0.6 | No separation |
| 4 | Indium oxide | Indium | Entirety | 98 | 42 | | | | 0.2 | 0.3 | No separation |
| 5 | Indium | Indium oxide | | | | Entirety | 28 | 17 | 0.9 | 1.0 | No separation |
| 6 | Indium | Indium oxide | | | | Entirety | 48 | 26 | 0.7 | 0.8 | No separation |
| 7 | Indium | Indium oxide | | | | Entirety | 101 | 48 | 0.5 | 0.4 | No separation |
| 8 | Indium oxide | Indium oxide | Entirety | 29 | 20 | Entirety | 30 | 19 | 0.5 | 0.4 | No separation |
| 9 | Indium oxide | Indium oxide | Entirety | 51 | 29 | Entirety | 49 | 25 | 0.3 | 0.2 | No separation |
| 10 | Indium oxide | Indium oxide | Entirety | 101 | 46 | Entirety | 98 | 48 | 0.1 | <0.1 | No separation |

*indicates a sample outside the scope of the present invention.

As clearly seen from the results of sample Nos. 2 to 10, in the sample holder 1 of the invention in which the layer region 5 was formed over the entire joining surface, the flatness and the parallelism did not vary even after the cooling-heating durability test of 300 cycles. In further detail, as clearly seen from the results of sample Nos. 2 to 10, it has been confirmed that the flatness and the parallelism can be maintained when the layer region 5 is formed in any one of the substrate 2 and the supporting member 3. In particular, from the results of sample Nos. 8 to 10, it has been confirmed that when the layer region 5 is formed in both of the substrate 2 and the supporting member 3, the flatness and the parallelism can more satisfactorily be maintained.

Further, from the results of sample Nos. 2 to 4, 5 to 7, and 8 to 10, it has been confirmed that a larger RzJIS, that is, a larger height difference in the unevenness, allows the flatness and the parallelism to be maintained more satisfactory.

EXAMPLE 2

As for the sample holder 1 of the invention having the structure shown in FIGS. 3(a) to 3(c), 12 samples (sample Nos. 12 to 15, 17 to 20, and 22 to 25) were fabricated as follows. Specifically, first, the substrate 2 and the supporting member 3 composed of ceramics were prepared. The substrate 2 was constructed from an aluminum nitride having a diameter of 300 mm and a thickness of 15 mm. Fabrication of the substrate 2 was performed by a similar method to Example 1.

On the other hand, the supporting member 3 was fabricated by machining an aluminum A6061 alloy into a diameter of 300 mm and a thickness of 15 mm. This fabrication also was similar to Example 1 and the joining surface was finished by lapping into a surface roughness Ra of 1.6 μm or smaller.

Then, a mask fabricated from a heat-resistant adhesion polyimide sheet was prepared in which circular dots of a diameter of 5 or 10 mm were formed and arranged at even intervals of 10 mm in a portion of 5 or 10 mm from the outer periphery of the joining surface of the substrate 2 and/or the supporting member 3. Then, the mask was stuck at a predetermined position.

Then, molten metal of pure indium was introduced in the atmosphere over the entire joining surface of the substrate 2 and/or the supporting member 3 to which the mask was stuck. Then, the molten metal was spread thinly with a squeegee fabricated from polytetrafluoroethylene, such that the thickness became approximately 100 μm. Then, heating was performed at 180° C. for 10 minutes. After the layer region 5 composed of indium oxides has been formed as described here, natural cooling was performed and then the mask was removed. The layer region 5 was confirmed as being of indium oxides by analysis similar to that of Example 1. Here, as comparison objects, samples (sample Nos. 11, 16, and 21) in which the layer region 5 was formed over the entire joining surface were also fabricated.

The substrate 2 and the supporting member 3 formed as described above and provided with the layer region 5 were heated again to 175° C. in a predetermined atmosphere. Then, a spacer composed of a φ0.6-mm copper (Cu) wire is placed on the layer region 5 of the supporting member 3 to be arranged on the lower side at the time of joining, and then molten metal of pure indium was newly poured. After that, the joining surface of the substrate 2 was laid thereon, then a weight was placed such that the joining load becomes 0.05 MPa, and then natural cooling was performed so that the portion other than the layer region 5 in the joining layer 4 was formed.

Then, the parallelism and the flatness of the fabricated sample holder 1 were measured with a three-dimensional measurement machine. Then, a portion of the supporting member 3 extending by 5 mm from the lower face on the side opposite to the joining surface was immersed and left for 30 minutes in a thermostatic oven in which silicone oil heated at 120° C. was circulated. After that, the holding surface of the substrate 2 was observed with an infrared camera (a thermo viewer). Then, the difference between the maximum temperature and the minimum temperature in the obtained temperature profile was measured as an intra-surface temperature variation ΔT.

After that, with adopting a definition that a cycle of heating from 0° C. to 120° C. and then cooling from 120° C. to 0° C. is counted as one cycle, a cooling-heating durability test of 300 cycles was performed. After the durability test, the parallelism and the flatness were measured again with the three-dimensional measurement machine and then the change ratios from the initial values were calculated. At that time, a change ratio of 1% or smaller was defined as no change from the initial value in the flatness and the parallelism. Further, after the above-mentioned cooling-heating durability test, ΔT was measured again. The results of measurement are shown in Table 2.

TABLE 2

| Sample No. | Substrate-side layer region composition | Supporting member-side layer region composition | Substrate-side layer region Formation region | Substrate-side layer region Dot diameter [mm] | Supporting member-side layer region Formation region | Supporting member-side layer region Dot diameter [mm] | Initial ΔT [° C.] | After 300 cycles of 0° C.↔120° C. ΔT [° C.] | After 300 cycles of 0° C.↔120° C. Flatness change ratio [%] | After 300 cycles of 0° C.↔120° C. Parallelism change ratio [%] | After 300 cycles of 0° C.↔120° C. Ultrasonic crack inspection |
|---|---|---|---|---|---|---|---|---|---|---|---|
| 11 | Indium oxide | Indium | Entirety | | | | 2.0 | 2.1 | 0.3 | 0.3 | No separation |
| 12 | Indium oxide | Indium | Outer 5 mm | 5 | | | 1.6 | 1.6 | 0.4 | 0.3 | No separation |
| 13 | Indium oxide | Indium | Outer 5 mm | 10 | | | 1.2 | 1.2 | 0.5 | 0.4 | No separation |
| 14 | Indium oxide | Indium | Outer 10 mm | 5 | | | 1.8 | 1.8 | 0.3 | 0.3 | No separation |
| 15 | Indium | Indium | Outer 10 mm | 10 | | | 1.5 | 1.5 | 0.4 | 0.3 | No separation |
| 16 | Indium | Indium oxide | | | Entirety | | 2.2 | 2.2 | 0.5 | 0.4 | No separation |
| 17 | Indium | Indium oxide | | | Outer 5 mm | 5 | 1.8 | 1.8 | 0.6 | 0.4 | No separation |
| 18 | Indium | Indium oxide | | | Outer 5 mm | 10 | 1.4 | 1.4 | 0.7 | 0.5 | No separation |
| 19 | Indium | Indium oxide | | | Outer 10 mm | 5 | 2.0 | 2.0 | 0.5 | 0.5 | No separation |
| 20 | Indium | Indium oxide | | | Outer 10 mm | 10 | 1.6 | 1.6 | 0.6 | 0.5 | No separation |
| 21 | Indium oxide | Indium oxide | Entirety | | Entirety | | 2.8 | 2.8 | 0.1 | <0.1 | No separation |
| 22 | Indium oxide | Indium oxide | Outer 5 mm | 5 | Outer 5 mm | 5 | 1.6 | 1.6 | 0.2 | 0.1 | No separation |
| 23 | Indium oxide | Indium oxide | Outer 5 mm | 10 | Outer 5 mm | 10 | 1.2 | 1.2 | 0.3 | 0.2 | No separation |
| 24 | Indium oxide | Indium oxide | Outer 10 mm | 5 | Outer 10 mm | 5 | 1.8 | 1.8 | 0.2 | 0.2 | No separation |
| 25 | Indium oxide | Indium oxide | Outer 10 mm | 10 | Outer 10 mm | 10 | 1.5 | 1.5 | 0.2 | 0.2 | No separation |

As clearly seen from the results of sample Nos. 12 to 15, 17 to 20, and 22 to 25, in the sample holder 1 of the invention in which the layer region 5 was formed in a part of the joining surface, it has been confirmed that the flatness and the parallelism did not vary even after the cooling-heating durability test of 300 cycles.

Further, from the comparison results of ΔT of the various samples, it has been confirmed that when pure indium was present partly in the joining surface, the temperature distribution in the holding surface of the substrate 2 was improved. This is expectedly because the thermal stress generated in the layer region 5 was alleviated by the pure indium having a low Young's modulus so that adhesion of the layer region 5 was not damaged. Further, it is expected that the heat homogeneity was improved because of a satisfactory thermal conductivity of pure indium.

EXAMPLE 3

As for the sample holder 1 of the invention having the structure of FIG. 6, 13 samples (samples Nos. 27 to 39) were fabricated as follows. Specifically, first, the substrate 2 and the supporting member 3 composed of ceramics were prepared. The substrate 2 was constructed from an aluminum nitride having a diameter of 300 mm and a thickness of 15 mm. A ceramic green sheet was fabricated by a similar method to Example 1. Then, among a predetermined number of ceramic green sheets constituting the substrate 2, predetermined shapes was printed and formed by a screen printing method by employing tungsten paste onto ceramic green sheets in which the electrostatic adsorption electrode 8 and the heat-generating resistor 9 were to be formed.

Then, in order to form the electrostatic adsorption electrode 8 and the heat-generating resistor 9 at predetermined positions in the substrate 2, the ceramic green sheets on which the tungsten paste was not printed and an electrode formation green sheet and a heat-generating resistor formation green sheet on which the tungsten paste has been printed were laid on each other. Then, stacking was performed at a temperature of 80° C. or higher with applying a pressure higher than or equal to the yield stress of the green sheet, specifically, a pressure of 5 MPa, by using a uniaxial pressing method.

Then, the obtained stack was fired in a reducing atmosphere at 2000° C. for 3 hours so that the substrate 2 was obtained. In the obtained substrate 2, thickness machining was performed by a rotary grinding process and then a gas introduction hole was formed by machining. Further, the holding surface was lapped and finished into an arithmetic mean roughness Ra of 0.1 μm or smaller and then a gas passage having a height of 12 μm was formed in a predetermined pattern by a sandblast method employing a mask. Further, the surface constituting the joining surface was finished by lapping into an arithmetic mean roughness Ra of 1.6 μm or smaller.

Here, in sample Nos. 34 to 39, the covering layer 7 composed of a metal having a higher standard redox potential $E^O$ than indium was formed on the lower face of the substrate 2. Specifically, in sample Nos. 34 and 37, an active brazing material composed of 70 mass % of Ag, 28 mass % of Cu, and 2 mass % of Ti was fired almost over the entire joining surface of the substrate 2 at 810° C. in vacuum so that the covering layer 7 of 20 μm was formed. Further, in sample Nos. 35 and 38, processing similar to that of sample Nos. 34 and 37 was performed and, after that, electroless Ni plating was performed on the active brazing material so that a Ni-plated layer of 3 μm was further provided as the covering layer 7. Further, in sample Nos. 36 and 39, copper (Cu) was provided into a thin film shape almost over the entire joining surface by vacuum deposition so that the covering layer 7 was fabricated. Here, the expression "almost over the entire surface" indicates that the covering layer 7 is provided to an extent that insulation with metal terminals extracted from the electrostatic adsorption electrode 8, the heat-generating resistor 9, and the like can be ensured.

On the other hand, the supporting member 3 was fabricated by machining an aluminum A6061 alloy into a diameter of 300 mm and a thickness of 30 mm. A predetermined water passage through which cooling water was circulated was formed in the inside of the supporting member. The water passage was formed such that the introduction hole and the discharge hole for the circulated water were located in a face different from the joining surface. Further, the gas introduction hole 11 and the terminal hole were formed such as to avoid the water passage. The joining surface of the supporting member 3 was finished by lapping into an arithmetic mean roughness Ra of 1.6 μm or smaller.

Here, in sample Nos. 28, 29, 31, 32, and 34 to 39, the covering layer 7 composed of a metal having a higher standard redox potential $E^O$ than indium was formed on the upper face of the supporting member 3. Specifically, in sample Nos. 28, 31, and 34 to 36, Zn plating of thickness 1 µm was preparatorily performed almost over the entire joining surface of the supporting member 3 and then electroless Ni plating of thickness 5 µm was performed thereon so that the covering layer 7 was fabricated. Here, Ni is the noble metal having a higher standard redox potential $E^O$ than indium. Further, in sample Nos. 29, 32, and 37 to 39, Cu was provided into a thin film shape over the entire joining surface of the supporting member 3 by vacuum deposition so that the covering layer 7 was fabricated. Here, Cu is the noble metal having a higher standard redox potential $E^O$ than indium.

Then, molten metal of pure indium was introduced almost over the entire joining surface of the substrate 2 and/or the supporting member 3 in the atmosphere and then spread thinly with a squeegee fabricated from polytetrafluoroethylene, such that the thickness became approximately 100 µm. Then, heating was performed at 180° C. for 10 minutes so that the layer region 5 composed of indium oxides was formed. In another procedure, the layer region 5 was confirmed as being of indium oxides by an analysis technique similar to that of Example 1.

The substrate 2 and/or the supporting member 3 provided with the layer region 5 formed as described above were heated again to 175° C. in a predetermined atmosphere and then molten metal of pure indium was poured on the upper face or the layer region 5 of the supporting member 3 to be arranged on the lower side at the time of joining. After that, the joining surface of the substrate 2 was laid thereon, then a weight was placed such that the joining load becomes 0.2 MPa, and then natural cooling was performed so that the portion other than the layer region 5 in the joining layer 4 was formed.

As a comparison object, a sample holder (sample No. 26) by a publicly known technique was also fabricated. The substrate and the supporting member was heated to 170° C. in an $N_2$ atmosphere and then molten metal of pure indium was introduced respectively to the entire joining surfaces so that an underlayer of indium was formed. Then, indium molten metal was added immediately and then the both were bonded together so that they were joined together. As for the underlayer, a test piece was fabricated apart from the objects for the evaluation described below and then analysis similar to the above-mentioned one was performed. According to the result, the underlayer was composed of pure indium.

The parallelism and the flatness of the fabricated sample holder 1 were measured with a three-dimensional measurement machine. Then, in a state where cooling water was circulated through the supporting member 3 at a predetermined flow rate, the heat-generating resistor 9 was energized with observing the holding surface of the substrate 2 by using an infrared camera (a thermo viewer) and thereby the maximum temperature within the holding surface was fixed at 120° C. At that time, the difference between the maximum temperature and the minimum temperature in the obtained temperature profile was measured as an intra-surface temperature variation ΔT. Here, when the temperature profile obtained by the infrared camera was checked until cooling was completed after the energization to the heat-generating resistor 9 was stopped, the temperature falling rate in the holding surface was uniform.

Then, the sample holder 1 was fixed to a publicly known plasma reaction vacuum chamber. In the plasma reaction vacuum chamber, an RF (radio frequency) electric power is used in order to generate a high-frequency plasma and then impart energy to the generated plasma so as to control it. An RF supply electric power and an RF bias electric power were connected to an RF power supply. Then, the RF supply electric power was connected to an induction coil of the chamber and the RF bias electric power was connected to the supporting member 3 (not shown). As such, the RF bias electric power was capacitively coupled to the plasma through a silicon wafer serving as a to-be-held object and through the supporting member 3 in cooperation with a ground electrode installed in a plasma generating region in the chamber provided with a feedback circuit for the bias current. The frequency of the RF bias was set to be 13.56 MHz.

Further, in a state where cooling water was circulated through the supporting member 3 at a predetermined flow rate, the heat-generating resistor was energized and heated such that the holding surface became 120° C. In this state, the following evaluation was performed.

In a state where processing was performed such that that a high-frequency plasma was generated for 70 seconds in one cycle, a predetermined voltage was applied on the electrostatic adsorption electrode 8 so that a silicon wafer having a diameter of 300 mm was adsorbed and fixed onto the holding surface. Measurement of the adsorption force was performed by using a load cell. That is, the high frequency and the RF bias were cut after 70 seconds has elapsed. Then, an adsorption force fluctuation having appeared in the adsorption force at that time was observed and then the change ratio of the adsorption force before and after the RF bias cut was calculated. A change ratio of 2% or smaller was defined as no adsorption force fluctuation. Then, the high-frequency plasma processing was stopped and then the adsorption force was measured.

After that, the sample holder 1 was taken out from the vacuum chamber. Then, with adopting a definition that a cycle of heating from 0° C. to 120° C. and then cooling from 120° C. to 0° C. is counted as one cycle, a cooling-heating durability test of 300 cycles was performed. After the durability test, the parallelism and the flatness were measured again with the three-dimensional measurement machine and then the change ratios from the initial values were calculated. At that time, a change ratio of 1% or smaller was treated as no change in the parallelism and the flatness.

Further, after the cooling-heating durability test, as described above, in a state where the high-frequency plasma processing in the vacuum chamber was stopped, the adsorption force at 120° C. was measured and then the adsorption force change ratio before and after the cooling-heating durability was calculated. At that time, a change ratio of 2% or smaller was treated as no change in the adsorption force.

At the last, in the sample holder 1, a continuous durability of leaving at 120° C. for 1000 hours was performed. After the durability test, the parallelism and the flatness were measured again with the three-dimensional measurement machine and then the change ratios from the initial values were calculated.

Further, ultrasonic crack inspection has been performed before and after the above-mentioned cooling-heating durability test and before and after the continuous durability test. However, in the sample holder 1 of the invention, separation did not occur in the joining layer 4, the layer region 5, or the covering layer 7. In contrast, in sample No. 26 serving as a comparison object, separation of the substrate 2 was confirmed in a part of the outer peripheral edge portion, and thus, the subsequent continuous durability test was not performed. The results are shown in Table 3.

TABLE 3

| Sample No. | Substrate-side layer region | Support member-side layer region | Substrate-side layer region composition | Support member-side layer region composition |
|---|---|---|---|---|
| *26 | None | None | Indium | Indium |
| 27 | None | None | Indium | Indium oxide |
| 28 | None | Ni | Indium | Indium oxide |
| 29 | None | Cu | Indium | Indium oxide |
| 30 | None | None | Indium oxide | Indium |
| 31 | None | Ni | Indium oxide | Indium |
| 32 | None | Cu | Indium oxide | Indium |
| 33 | None | None | Indium oxide | Indium oxide |
| 34 | Active brazing | Ni | Indium oxide | Indium oxide |
| 35 | Active brazing + Electroless Ni | Ni | Indium oxide | Indium oxide |
| 36 | Cu | Ni | Indium oxide | Indium oxide |
| 37 | Active brazing | Cu | Indium oxide | Indium oxide |
| 38 | Active brazing + Electroless Ni | Cu | Indium oxide | Indium oxide |
| 39 | Cu | Cu | Indium oxide | Indium oxide |

| | Initial | | After 300 cycles of 0° C. ↔ 120° C. | | | | After continuous 1000 hours at 120° C. | | |
|---|---|---|---|---|---|---|---|---|---|
| Sample No. | ΔT [° C.] | Adsorption force fluctuation | Adsorption force change | Flatness change ratio [%] | Parallelism change ratio [%] | Ultrasonic crack inspection | Flatness change ratio [%] | Parallelism change ratio [%] | Ultrasonic crack inspection |
| *26 | 3.5 | NG | NG | 15 | 8 | With separation | | | |
| 27 | 2.2 | OK | OK | 0.5 | 0.5 | No separation | 0.7 | 0.6 | No separation |
| 28 | 2.0 | OK | OK | 0.5 | 0.4 | No separation | 0.5 | 0.4 | No separation |
| 29 | 1.9 | OK | OK | 0.5 | 0.5 | No separation | 0.5 | 0.5 | No separation |
| 30 | 2.0 | OK | OK | 0.4 | 0.3 | No separation | 0.6 | 0.5 | No separation |
| 31 | 2.0 | OK | OK | 0.5 | 0.3 | No separation | 0.5 | 0.3 | No separation |
| 32 | 1.9 | OK | OK | 0.4 | 0.4 | No separation | 0.4 | 0.3 | No separation |
| 33 | 2.3 | OK | OK | 0.2 | 0.1 | No separation | 0.3 | 0.1 | No separation |
| 34 | 1.9 | OK | OK | 0.2 | 0.1 | No separation | 0.2 | 0.1 | No separation |
| 35 | 1.9 | OK | OK | 0.3 | 0.1 | No separation | 0.3 | 0.1 | No separation |
| 36 | 1.8 | OK | OK | 0.2 | 0.1 | No separation | 0.2 | 0.1 | No separation |
| 37 | 1.8 | OK | OK | 0.1 | <0.1 | No separation | 0.1 | <0.1 | No separation |
| 38 | 1.8 | OK | OK | 0.2 | <0.1 | No separation | 0.2 | <0.1 | No separation |
| 39 | 1.7 | OK | OK | 0.1 | <0.1 | No separation | 0.1 | <0.1 | No separation |

*indicates a sample outside the scope of the present invention.

From the results of sample Nos. 27 to 39, it has been confirmed that fluctuation in the adsorption force did not occur before and after the RF bias cut. This is expectedly because the indium oxides that form the layer region 5 have a higher resistivity than the surrounding metals (the pure indium of the joining layer 4, aluminum of the supporting member 3, Ni or Cu of the covering layer 7, and the like) and hence serve as a resistive noise filter so that a high-frequency noise caused by the RF bias is not superposed on the adsorption force.

Further, from the results of sample Nos. 28, 29, 31, 32, and 34 to 39, it has been confirmed that the flatness and the parallelism were more stably maintained after the continuous durability of 120° C. and 1000 hour. This is expectedly because since the covering layer 7 containing as the main component a noble metal having a higher standard redox potential $E^o$ than indium (the standard redox potential $E^o$ of indium=−0.34 V) was provided in at least one of the joining surface of the substrate 2 and the joining surface of the supporting member 3, temporal corrosion caused by contact of dissimilar metals, that is, anodic dissolution of the supporting member 3 in the present example, was prevented.

Further, from the results of sample Nos. 34, 35, 37, and 38, it has been confirmed that when the covering layer 7 is formed from an active brazing material, the flatness and the parallelism can more stably be maintained.

REFERENCE SIGNS LIST

1: Sample holder
2: Substrate
3: Supporting member
4: Joining layer
5: Layer region
6: Intermediate region
7: Covering layer
8: Electrostatic adsorption electrode
9: Heat-generating resistor
10: Passage
11: Gas introduction hole
12: DC power supply
13: To-be-held object

The invention claimed is:

1. A sample holder, comprising:
    a substrate composed of ceramics, having a sample holding surface provided in an upper face thereof;
    a supporting member composed of metal, an upper face of the supporting member covering a lower face of the substrate; and
    a joining layer composed of indium or an indium alloy, the substrate and the supporting member being joined to each other via the joining layer,
    the joining layer having a layer region in at least one of a joining surface to the substrate and a joining surface to the supporting member, a content percentage of indium oxides of the layer region being higher than that of an intermediate region in a thickness direction of the joining layer.

2. The sample holder according to claim 1, wherein in the joining layer, the layer region is located in the joining surface to the substrate and the joining surface to the supporting member.

3. The sample holder according to claim 1, wherein in the layer region, a portion composed of the indium oxides and a portion composed of the indium or the indium alloy are mixed within the joining surface to the substrate.

4. The sample holder according to claim 1, wherein in the layer region, a portion composed of the indium oxides and a portion composed of the indium or the indium alloy are mixed within the joining surface to the supporting member.

5. The sample holder according to claim 1, wherein an interface between the intermediate region and the layer region is an uneven surface.

6. The sample holder according to claim 1, wherein a covering layer containing one or more of metals having a higher standard redox potential $E_O$ than indium is provided in at least one of the lower face of the substrate and the upper face of the supporting member.

7. The sample holder according to claim 6, wherein the covering layer contains at least one of nickel, copper, and silver-copper-titanium.

8. The sample holder according to claim 1, wherein the substrate includes an electrode for electrostatic adsorption located in an inside thereof.

9. The sample holder according to claim 1, wherein the substrate includes a heat-generating resistor located in an inside thereof.

10. The sample holder according to claim 1, wherein the supporting member includes a liquid passage located in an inside thereof.

\* \* \* \* \*